(12) United States Patent
Paasio

(10) Patent No.: US 10,833,677 B2
(45) Date of Patent: Nov. 10, 2020

(54) LOW POWER LOGIC FAMILY

(71) Applicant: Ari Paasio, Littoinen (FI)

(72) Inventor: Ari Paasio, Littoinen (FI)

( * ) Notice: Subject to any disclaimer, the term of this patent is extended or adjusted under 35 U.S.C. 154(b) by 0 days.

(21) Appl. No.: 15/768,549

(22) PCT Filed: Oct. 24, 2016

(86) PCT No.: PCT/FI2016/000026
§ 371 (c)(1),
(2) Date: Apr. 15, 2018

(87) PCT Pub. No.: WO2017/068233
PCT Pub. Date: Apr. 27, 2017

(65) Prior Publication Data
US 2018/0287611 A1 Oct. 4, 2018

(30) Foreign Application Priority Data
Oct. 23, 2015 (FI) .................................. 20150294

(51) Int. Cl.
*H03K 19/00* (2006.01)
*H03K 19/017* (2006.01)
(Continued)

(52) U.S. Cl.
CPC ........... *H03K 19/0013* (2013.01); *G05F 3/20* (2013.01); *H03K 19/0027* (2013.01); *H03K 19/01707* (2013.01); *H03K 19/09441* (2013.01)

(58) Field of Classification Search
None
See application file for complete search history.

(56) References Cited

U.S. PATENT DOCUMENTS 4,739,191 A * 4/1988 Puar ..................... G05F 3/205
327/536
5,729,154 A * 3/1998 Taguchi ........... H03K 19/00384
326/30
(Continued)

FOREIGN PATENT DOCUMENTS

JP  2008-J16370  * 7/2008
WO  WO-2004105224 A1 * 12/2004 ............ H02M 7/217

*Primary Examiner* — Lincoln D Donovan
*Assistant Examiner* — Khareem E Almo
(74) *Attorney, Agent, or Firm* — Mark M. Friedman

(57) ABSTRACT

According to the invention, only one type of enhancement MOS transistor type is used in implementing typical Boolean functions in hardware. Preferably, the MOS transistor type allows back bias control for adjusting and compensating the operation conditions. When implemented in PMOS only transistors, the pull-down functionality is performed by a single transistor with its gate and source connected to the output. This type of connection ensures that the pull-down functionality is performed by the leakage current of the pull-down transistor. The leakage currents of all the pull-up transistors need to be smaller than this pull-down current when all the pull-up paths are off. The ratio of these off-currents can be adjusted by the aspect ratios of the transistors. The logic type offers extremely low current consumption with low voltages and offers the possibility to avoid more complex shut-down circuitry often used in ultra low-power designs. The logic type offers higher operation speed compared to the existing solutions.

7 Claims, 5 Drawing Sheets

(51) Int. Cl.
   *H03K 19/0944*   (2006.01)
   *G05F 3/20*      (2006.01)

(56) References Cited

U.S. PATENT DOCUMENTS

| | | | | |
|---|---|---|---|---|
| 9,391,519 | B2* | 7/2016 | Lu | H02M 3/158 |
| 9,620,501 | B1* | 4/2017 | Ellinger | H01L 29/7869 |
| 10,110,221 | B1* | 10/2018 | Sharma | H02M 1/38 |
| 2007/0262793 | A1* | 11/2007 | Kapoor | H01L 29/8086 |
| | | | | 326/101 |
| 2008/0175045 | A1* | 7/2008 | Lin | H03K 3/35625 |
| | | | | 365/182 |
| 2011/0133822 | A1* | 6/2011 | Mazure | H01L 21/84 |
| | | | | 327/537 |
| 2012/0154021 | A1* | 6/2012 | Patil | H03K 3/356034 |
| | | | | 327/534 |
| 2013/0181221 | A1* | 7/2013 | Kaneko | H01L 27/088 |
| | | | | 257/57 |
| 2014/0015509 | A1* | 1/2014 | Gupta | G05F 3/30 |
| | | | | 323/313 |
| 2014/0266314 | A1* | 9/2014 | Iriarte | H03K 5/2472 |
| | | | | 327/81 |
| 2016/0079844 | A1* | 3/2016 | Kinzer | H01L 27/0883 |
| | | | | 323/272 |
| 2016/0079975 | A1* | 3/2016 | Kinzer | H02M 1/36 |
| | | | | 327/109 |
| 2016/0126242 | A1* | 5/2016 | Ellinger | H01L 27/1251 |
| | | | | 257/43 |
| 2017/0222638 | A1* | 8/2017 | Gariboldi | G05F 3/16 |

* cited by examiner

LOW POWER LOGIC FAMILY

BACKGROUND

In the field of battery operated and energy harvesting Internet-of-Things devices, and especially in harvester only devices the power consumption of processing systems is of utmost importance. In digital circuits the power is consumed in leakage and switching operations, where the leakage typically dominates in low duty-cycled systems. In W. Lim et. al, "Batteryless Sub-nW Cortex-M0+ processor with dynamic leakage-suppression logic" IEEE ISSCC, pp. 146-148, February 2015, a logic arrangement for extremely low supply voltage was introduced where special attention has been paid to the leakage current minimization. The logic family inverter is shown in FIG. 1. The operating speed of this logic is in the order of 100 Hz and it is not straight forward to design logic with more than two inputs per gate.

In the field of printed electronics, where only PMOS type devices have been available, a special PMOS-only logic has been developed, where the pull-down path, typically implemented with NMOS transistors in CMOS, has been replaced by a single transistor with the gate of the pull-down transistor connected to the output. This is reported e.g. in S. De Vusser, J. Genoe, and P. Heremans, "Influence of Transistor Parameters on the Noise Margin of Organic Digital Circuits", IEEE Trans. on Electron Devices, vol. 53, pp. 601-610, April 2006 and shown in FIG. 2. It is notable in this type of arrangement that the pull-down PMOS is of depletion mode type, whereas in conventional CMOS process, both the NMOS and PMOS are enhancement mode transistors. The depletion mode transistor connected as the pull-down device is drawing considerable amount of current during the operation. Also, since the matching of the printed transistors is extremely bad compared to bulk CMOS, it is not straightforward to build stacked logic gates, especially without special attention paid to the bulk voltages of each individual transistor separately It is the purpose of the present innovation, to improve the operating speed of the logic compared to the one shown in FIG. 1 while still preserving the low leakage figure of merit. Additionally, the speed of operation of the new logic family and the associated leakage can be adjusted by using either forward or backward body bias, where also the effects of process and temperature changes can be accommodated.

SUMMARY

The main idea behind the new logic family is to use a leakage current of a PMOS (NMOS) transistor for pull-down (pull-up) means and a conventional arrangement for the pull-up (pull-down) structure. An inverter realized in accordance to the invention is shown in FIG. 3, where both transistors are implemented in bulk CMOS enhancement type PMOS transistors. Typical values for the VDD are process specific, but are in the order of few hundred millivolts. The speed and leakage control of the gate can be adjusted by controlling the body bias of the devices. Although in FIG. 3 both transistors are implemented in the same n-well and have the same body bias control voltage, other arrangements are also possible, like having a separate control for the pull-up and pull-down transistors. According to FIG. 3, when the voltage at the input (IN) of the inverter is at VDD, the pull-up transistor is off with its associated leakage current present. In order for the pull-down transistor M2, to be able to pull down the output voltage at the output (OUT), the leakage current of the M1 with its source and gate at VDD has to be lower that the leakage current of M2. In order for the logic output to drive the next stage input LOW, within the same logic family, the output has to settle not exactly to GND, but low enough for the driven pull-up transistor to be able to pull the output of the next gate high. The respective leakage current levels of the pull-down and pull-up paths can be designed accordingly by the aspect ratios (transistor width (W) divided by the transistor length (L)) of the transistors. In a typical case, the aspect ratio of the pull-down device is considerably larger than the corresponding ratio of the pull-up device. When the input of the inverter in FIG. 3 is LOW, meaning low enough according to the previous description, the pull-up transistor M1 is on and having a stronger on current than the leakage current of the pull-down, the output is pulled to VDD, or in some cases close enough to VDD for the following gate to operate according to the description for the pull-up device to have a lower leakage current compared to the pull-down transistor.

An inverter only does not introduce a computing structure, whereas e.g. a NAND or a NOR gate do. The simple inverter can be expanded into a NOR gate by connecting multiple pull-up devices in series while leaving the pull-down for a single PMOS transistor. This arrangement is shown in FIG. 4 with two pull-up transistors M1 and M2 and with the pull-down transistor M3. In this case, since the leakage of the stacked transistors is typically less than the leakage of a corresponding single transistor with same aspect ratios, in stacked structures, according to the invention, the aspect ratios of the stacked devices can be made larger, typically meaning that the length of the transistors can be reduced and the transistor areas made smaller. This is beneficial from the introduced loading effect point of view, where the charging and discharging of a smaller transistor is faster and requires less power. NAND gates are easily constructed from the basic inverter by connecting multiple pull-up transistors in parallel as shown in FIG. 5, where the transistors M1 and M2 each separately can pull the output node HIGH. In this case, since each parallel branch contributes to the total pull-up leakage that has to be lower than the pull-down leakage, by adding more parallel branches, the aspect ratios of the pull-up devices typically have to be lowered. It is also clear to an experienced expert, that any combination of series and parallel transistor arrangements for implementing more complicated logic functions is possible with the same method. Also, since both the pull-up and pull-down transistors experience the same realized process parameter conditions with the leakage levels correlating to each other and only local device mismatch is experienced, the structure can incorporate pull-up structures with more than two transistors in series opening up the possibility for a wider logic functionality compared to the prior art.

DESCRIPTION OF EMBODIMENTS

Figure 1:
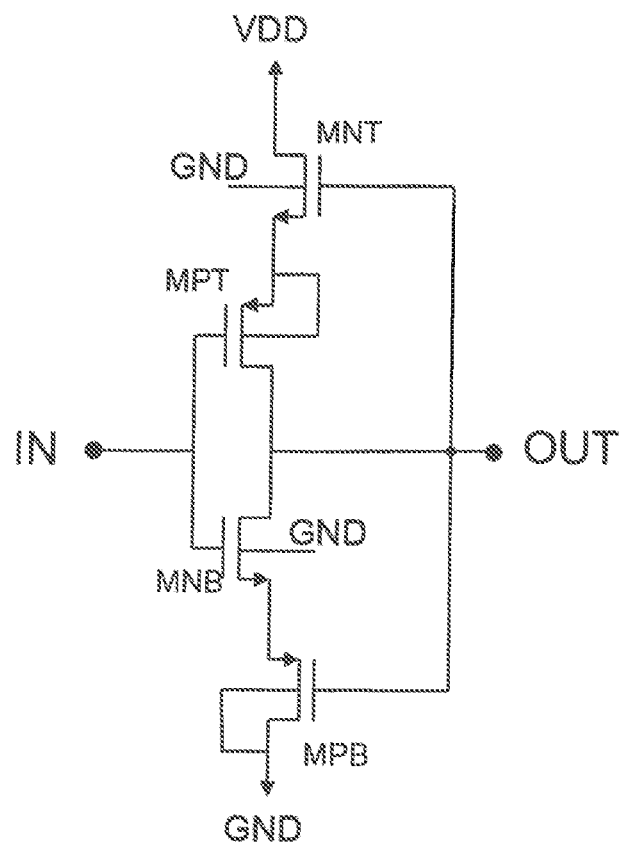
FIG. 1 shows a prior art inverter.
Figure 2:
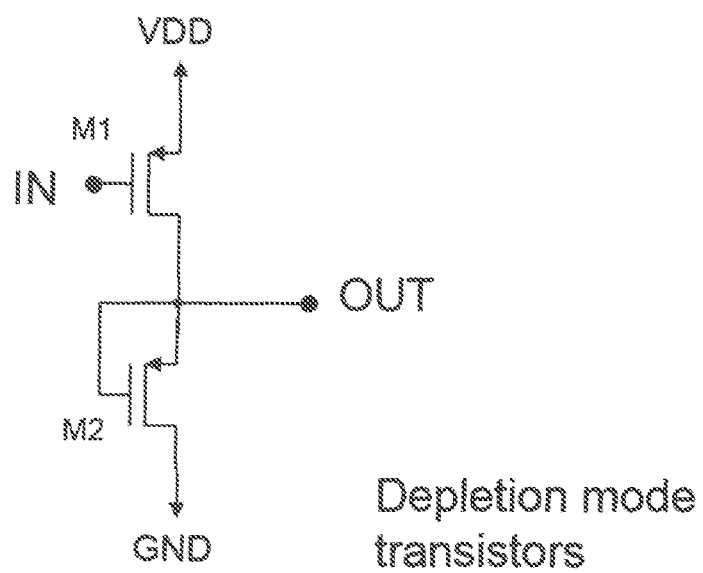
FIG. 2 shows a connection from printed electronics with depletion mode PMOS as a pull-down device.
Figure 3:
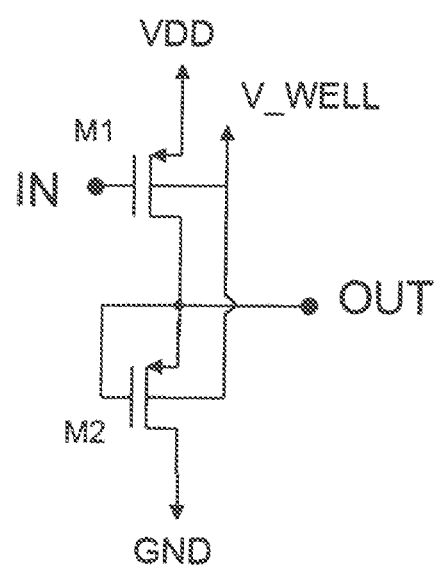
FIG. 3 shows an inverter realized of two enhancement mode PMOS transistors. The pull-up and pull-down operations are explained with the help of this figure. Substrate connections are not shown for clarity.

The invention is related to constructing digital gates realizing Boolean functions with two or more inputs, where the pull-up and pull-down devices are all of the same type. In case of all-PMOS implementation, the pull-down is realized by one PMOS transistor with its gate and source connected to the output, whereas the pull-up is realized by an arrangement implementing the actual Boolean function. If no pull-up paths are constructed, i.e. no pull-up paths from the power supply to the output are on, the output of the logic gate is pulled down by the pull-down device. In order for the pull-down device to pull the output LOW, the leakage current of the associated pull-down device has to be larger than the total leakage current of the pull-up network. The relative leakage current levels of the pull-down and pull-up branches depend on the aspect ratios of the corresponding transistors. In an exemplary illustration of the operation principle, in FIG. 3, an inverter is shown, where the transistor M1 is the pull-up device and the transistor M2 is the pull-down device. In an example case with 130 nm CMOS technology, with the power supply level of 0.2 volts, the W/L ratio of the pull-up transistor is (0.25 microns/1 microns) whereas the W/L ratio of the pull-down transistor is (1 micron/0.3 microns). Typical leakage current levels are few picoamperes or less. In one preferred embodiment of the invention, all the transistors are located in the same n-well, where the voltage of the well is V_WELL in FIG. 3. By lowering the voltage V_WELL, the gate operates faster and also consumes more power whereas by increasing the voltage V_WELL, the gate operates slower. Since the inherent operating speed of the logic in 130 nm CMOS and in room temperature is in the order of 1,000 to 10,000 Hz, lowering of the body voltage can be used e.g. occasionally when a speed boost is required by the processing algorithm to complete the task in a given time frame. As an example, in a room temperature with the V_WELL at GND and VDD at 0.2V, the operating speed of 100,000 Hz is easily achieved. A more typical need for adjustment of the body bias is due to the transistor driving capabilities depending on the temperature. With certain aspect ratios, e.g. the system may not be operational at all in 0 degrees Celsius without the lowering of the body level to e.g. GND. In this case, the diode formed by the sources of PMOS transistors at the positive power supply and the n-well is forward biased, but the forward bias is still tolerably low for the diode not to start conducting. On the other extent of temperature range, it is well understood, that in hot environments like 100 degrees Celsius, the leakage currents of transistors increase very much. This increase in leakage, and increase in power consumption, can be compensated by increasing the voltage V_WELL to e.g. 0.4V, which effectively decreases the leakage of the logic while still providing high enough speed for the main task. It is clear to the experts, that a similar basic functionality can be achieved with only NMOS transistors, where then a single NMOS transistor with its source and gate connected to the output acts as the pull-up device. If the body voltage of the NMOS construction can be adjusted as referenced to the lower supply voltage, a similar type of control and compensation method can be used for NMOS logic also.

Figure 4:
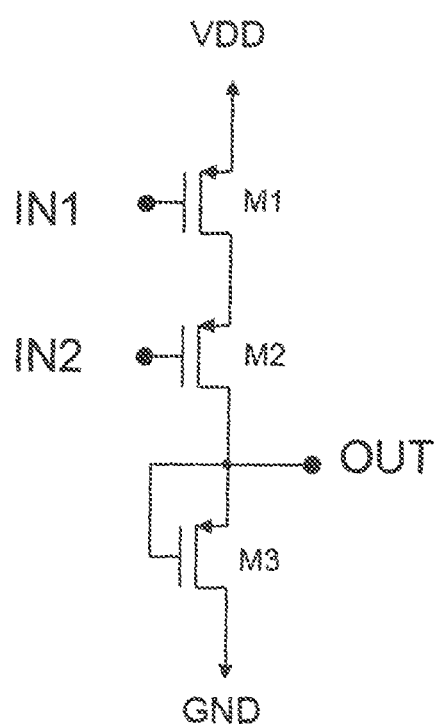
FIG. 4 shows a NOR gate according to the invention. Substrate connections are not shown for clarity.
Figure 5:
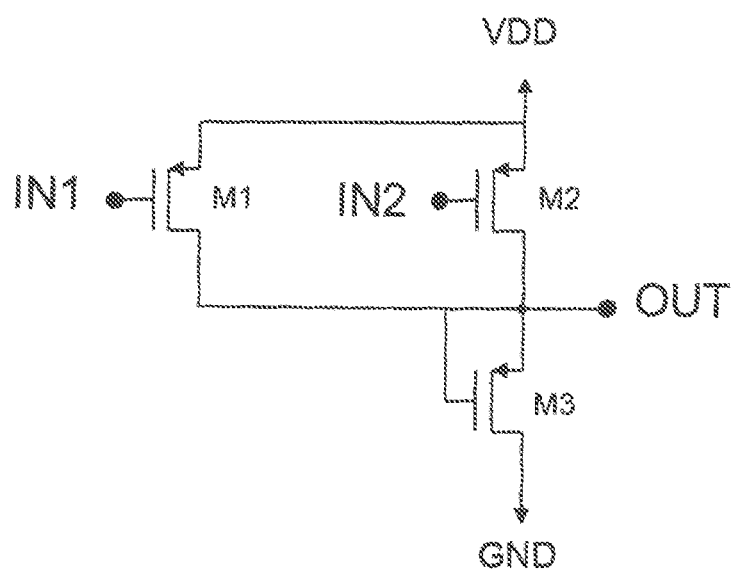
FIG. 5 shows a NAND gate according to the invention. Substrate connections are not shown for clarity.

According to the invention, there is only one pull-down device in a logic implementation connected according to the above description between the logic output and lower supply voltage whereas there are two or more pull-up devices of the same type as the pull-down device for implementing the targeted Boolean function. Examples for NOR and NAND are given in FIGS. 4 and 5, where typical W/L ratios are (0.25 microns/0.7 microns) for two input NOR and (0.25 microns/1.5 microns) for two input NAND gates with the pull-down transistor aspect ratio (1 micron/0.3 microns) and supply voltage VDD at level 0.2V referenced to the GND. The NOR and NAND type operations can also be combined to consist multiple parallel pull-up branches with one or more pull-up transistors in each branch. Each parallel branch can also branch into more pull-up branches somewhere in the pull-up path realizing complex Boolean functions with one single pull-down device. Since the relative matching of the same type MOS transistors on the same chip is rather high and since both pull-up and pull-down is realized by the same type MOS transistors, the pull-up and pull-down strengths correlate well despite the wafer to wafer parameter variations. This allows more than two stacked pull-up transistors in each pull-up branch and is an advantage over existing prior-art solutions that in practice—due to reliability issues—offer the possibility of logic gates with only two stacked transistors in either pull-up or pull-down branches.

What is claimed is:

1. A logic gate consisting of enhancement mode MOS transistors implementing Boolean function with at least two inputs, characterized in
    the first branch is realized by a single transistor with gate and source terminals connected to the output of the logic gate, and drain terminal to a first voltage;
    at least one second branch, the branches realizing the opposite logic operation to the first branch, where the at least one second branch consists of at least two serially connected transistors having different independent inputs associated with their gate terminals, wherein drain terminal of the serially connected transistors is connected to the output of the logic gate and source terminal of the serially connected transistors is connected to a second voltage, wherein the transistors in the first branch and the at least one second branch are having different aspect ratios;
    the first branch pulls the output close to any one of the first voltage and the second voltage when no second branch is in conductive mode, and the first branch pulls the output close to any one of the first voltage and the second voltage, when second branch is in conductive mode;
    all the transistors forming the logic gate have the same substrate voltage, wherein the substrate voltage of the transistors forming the gate is externally adjustable to control the switching speed of the logic gate.

2. The logic gate according to claim 1, wherein the enhancement mode transistors are of PMOS transistor.

3. The logic gate according to claim 2, wherein the first branch is pull-down transistor and the second branch is pull-up transistors.

4. The logic gate according to claim 3, wherein the pull-down branch pulls the output close to the first voltage when no pull-up branch is in conductive mode, and the pull-up branch pulls the output close to the second voltage, when at least one pull-up branch is in conductive mode.

5. The logic gate according to claim 1, wherein the enhancement mode transistors are of NMOS transistor.

6. The logic gate according to claim 5, wherein the first branch is pull-up transistor and the second branch is pull-down transistors.

7. The logic gate according to claim 6, wherein the pull-up branch pulls the output close to the second voltage when no pull-down branch is in conductive mode, and the pull-down branch pulls the output close to the first voltage, when at least one pull-down branch is in conductive mode.

* * * * *